(12) United States Patent
Kawai et al.

(10) Patent No.: US 9,960,178 B2
(45) Date of Patent: May 1, 2018

(54) SEMICONDUCTOR MEMORY DEVICE AND METHOD FOR MANUFACTURING SAME

(71) Applicant: Toshiba Memory Corporation, Minato-ku (JP)

(72) Inventors: Tomoya Kawai, Kawasaki (JP); Yoshiaki Fukuzumi, Yokkaichi (JP); Hideaki Aochi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 52 days.

(21) Appl. No.: 15/053,338

(22) Filed: Feb. 25, 2016

(65) Prior Publication Data

US 2016/0268274 A1 Sep. 15, 2016

Related U.S. Application Data

(60) Provisional application No. 62/132,842, filed on Mar. 13, 2015.

(51) Int. Cl.
*H01L 29/76* (2006.01)
*H01L 27/11582* (2017.01)

(52) U.S. Cl.
CPC .............................. *H01L 27/11582* (2013.01)

(58) Field of Classification Search
CPC ................................................ H01L 27/11582
See application file for complete search history.

(56) References Cited

U.S. PATENT DOCUMENTS

| 8,334,561 | B2 | 12/2012 | Fukuzumi et al. |
| 8,335,111 | B2 | 12/2012 | Fukuzumi et al. |
| 2008/0296565 | A1 | 12/2008 | Park et al. |
| 2009/0230459 | A1 | 9/2009 | Kito et al. |
| 2011/0031547 | A1* | 2/2011 | Watanabe ......... H01L 27/11582 257/319 |
| 2012/0273790 | A1 | 11/2012 | Aoyama et al. |
| 2014/0117366 | A1* | 5/2014 | Saitoh ............. H01L 21/823412 257/64 |

* cited by examiner

*Primary Examiner* — Samuel Gebremariam
(74) *Attorney, Agent, or Firm* — Oblon, McClelland, Maier & Neustadt, L.L.P.

(57) ABSTRACT

According to one embodiment, a semiconductor memory device includes a stacked body and a column. The stacked body includes a plurality of electrode layers. The column includes a semiconductor channel, a charge storage film, and a doped silicon layer. The semiconductor channel extends in the stacking direction. The semiconductor channel is a polycrystalline. An average grain size of crystals in a polycrystalline is not less than a film thickness of the semiconductor channel. The charge storage film is provided between the semiconductor channel and the electrode layers. The doped silicon layer contains a metal element and an impurity other than a metal element. The doped silicon layer is in contact with a top end of the semiconductor channel.

13 Claims, 11 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/132,842, filed on Mar. 13, 2015; the entire contents of which are incorporated herein by reference.

FIELD

Embodiments described herein relate generally to a semiconductor memory device and a method for manufacturing the same.

BACKGROUND

A memory cell array having three-dimensional structure is proposed. The memory cell array includes a stacked body including a plurality of electrode layers stacked via insulating layers. The electrode layer functions as a control gate in a memory cell. A memory hole is formed in the stacked body. A silicon body as a channel is provided on a side wall of the memory hole via a charge storage film.

As memory cells in such a three-dimensional memory device become smaller and denser, channel mobility in the thin channel may decrease.

DETAILED DESCRIPTION

Figure 1:
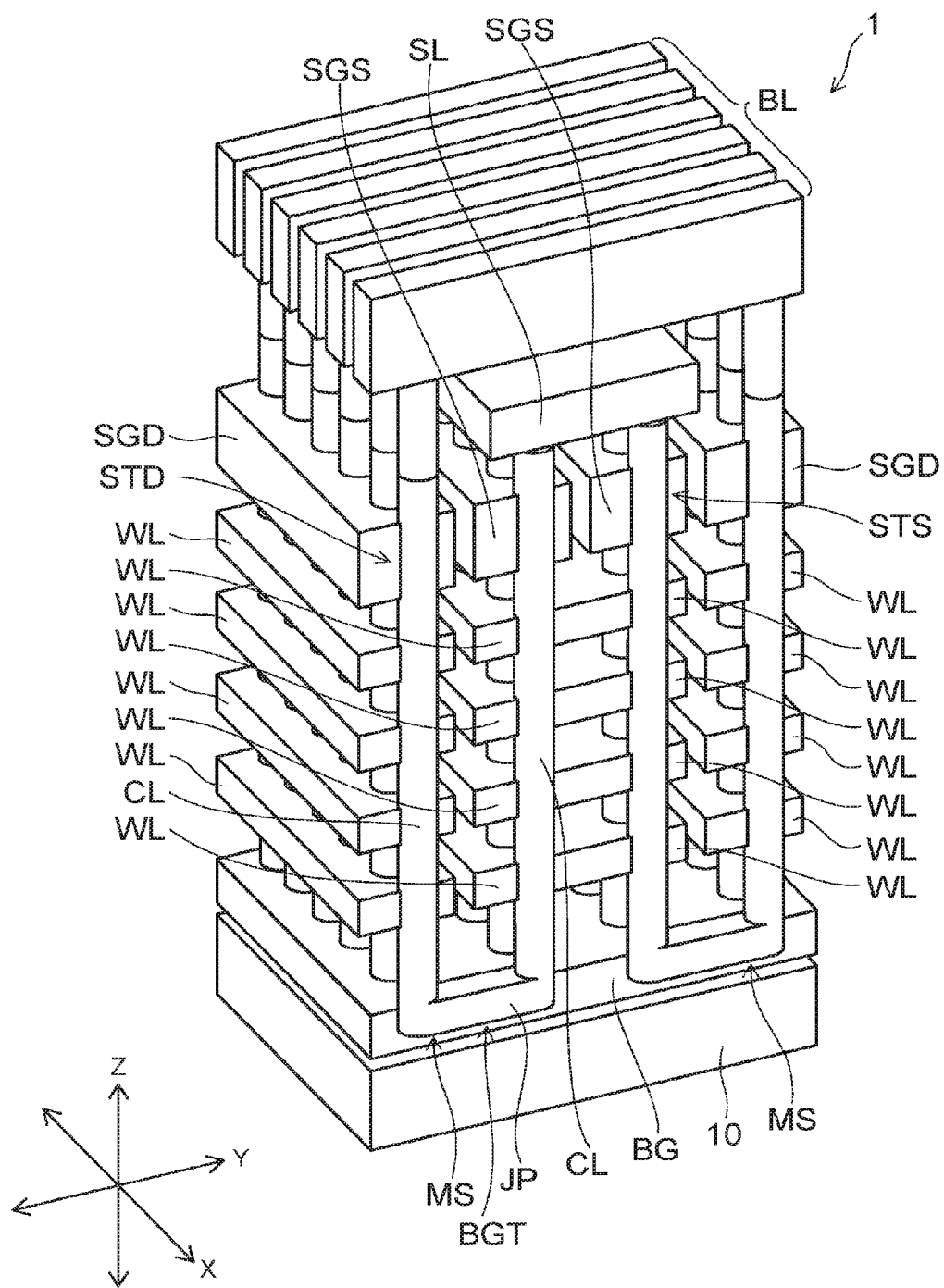
FIG. 1 is a schematic perspective view of a memory cell array of an embodiment.

According to one embodiment, a semiconductor memory device includes a stacked body and a column. The stacked body includes a plurality of electrode layers. An insulator is provided between the electrode layers. The column extends in a stacking direction in the stacked body. The column includes a semiconductor channel, a charge storage film, and a doped silicon layer. The semiconductor channel extends in the stacking direction. The semiconductor channel is a polycrystalline. An average grain size of crystals in a polycrystalline is not less than a film thickness of the semiconductor channel. The charge storage film is provided between the semiconductor channel and the electrode layers. The doped silicon layer contains a metal element and an impurity other than a metal element. The doped silicon layer is in contact with a top end of the semiconductor channel.

Hereinafter, with reference to the drawings, embodiments of the invention will be described. In the drawings, same reference numerals are labeled to the same elements.

FIG. 1 is a schematic perspective view of a memory cell array 1 of an embodiment. In FIG. 1, insulating layers between electrode layers, insulating isolating films, and the like have been omitted for ease of understanding the drawing.

In FIG. 1, two mutually perpendicular directions are defined as the X-direction and the Y-direction, and the direction in which the plurality of electrode layers WL is stacked perpendicular to the X-direction and the Y-direction (the XY plane) is defined as the Z-direction (stacking direction).

The memory cell array 1 includes a plurality of memory strings MS.

Figure 2:
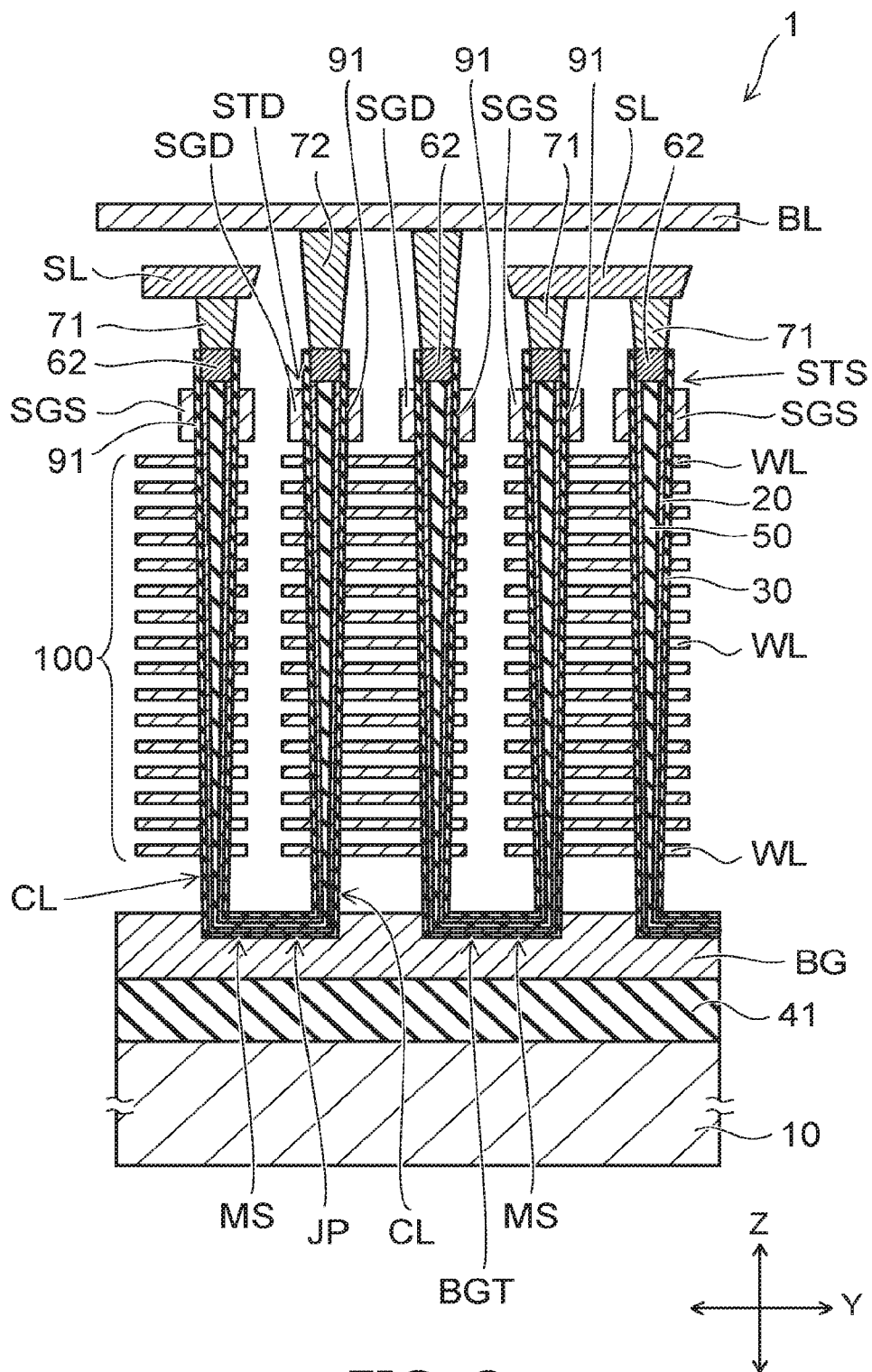
FIG. 2 is a schematic cross-sectional view of the memory cell array of the embodiment.

FIG. 2 is a schematic cross-sectional view of a memory string MS. FIG. 2 illustrates a cross-section parallel to the YZ plane in FIG. 1.

The memory cell array 1 includes a stacked body 100 that includes a plurality of electrode layers WL and a plurality of insulating layers 40 (illustrated in FIG. 3) stacked alternately one by one. The insulating layers 40 function as insulators. The insulating layers 40 are provided between the electrode layers WL. The insulators provided between the electrode layers WL may be air gaps.

The stacked body 100 is provided on a back gate BG as a lower gate layer. The number of electrode layers WL illustrated in the drawings is an example, and the number of electrode layers WL is optional. The back gate BG is provided over a substrate 10 interposed by an insulating layer 41.

The back gate BG and the electrode layer WL are layers containing silicon as the major component. The back gate BG and the electrode layer WL also contain, for example, boron as an impurity to confer conductivity to the silicon layer. The electrode layer WL may also contain a metal silicide. The electrode layer WL may also be a metal layer. The insulating layer 40 mainly contains, for example, silicon oxide.

One memory string MS is formed in a U-shape and includes a pair of columns CL extending in the Z-direction, and a connecting portion JP that connects bottom ends of each of the pair of columns CL. The columns CL are formed in, for example, a round column shape or an elliptical column shape, and penetrate through the stacked body 100 to reach the back gate BG.

Upper portion drain side selection gate layers (drain side selection gate SGD, source side selection gate SGS) are provided on the topmost layer of the electrode layers WL interposed by an insulating layer. The drain side selection gate SGD is provided on a top end portion of one of the pair of columns CL in the U-shaped memory string MS, and the source side selection gate SGS is provided on a top end portion of the other.

The drain side selection gate SGD and the source side selection gate SGS are layers containing silicon as the major component. The drain side selection gate SGD and the source side selection gate SGS also contain, for example, boron as an impurity to confer conductivity to the silicon layer. The drain side selection gate SGD and the source side selection gate SGS may be layers containing metal. For example, the drain side selection gate SGD, the source side selection gate SGS, and the back gate BG are thicker than one electrode layer WL. The drain side selection gate SGD and the source side selection gate SGS may have a plurality of layers, respectively.

The drain side selection gate SGD and the source side selection gate SGS are also referred to generically as an "upper portion selection gate layer SG" hereinafter. As illustrated in FIGS. 9A to 10C, an insulating layer 42 is provided above the upper portion selection gate layer SG.

The drain side selection gate SGD and the source side selection gate SGS are isolated in the Y-direction. The stacked body 100 below the drain side selection gate SGD and the stacked body 100 below the source side selection gate SGS are isolated in the Y-direction. In other words, the stacked bodies 100 between the pair of columns CL of the memory string MS are isolated in the Y-direction.

A source layer (for example, a metal layer) SL is provided above the source side selection gate SGS. A plurality of bit lines (for example, metal films) BL is provided above the drain side selection gate SGD and above the source layer SL. The bit lines BL extend in the Y-direction.

Figure 3:
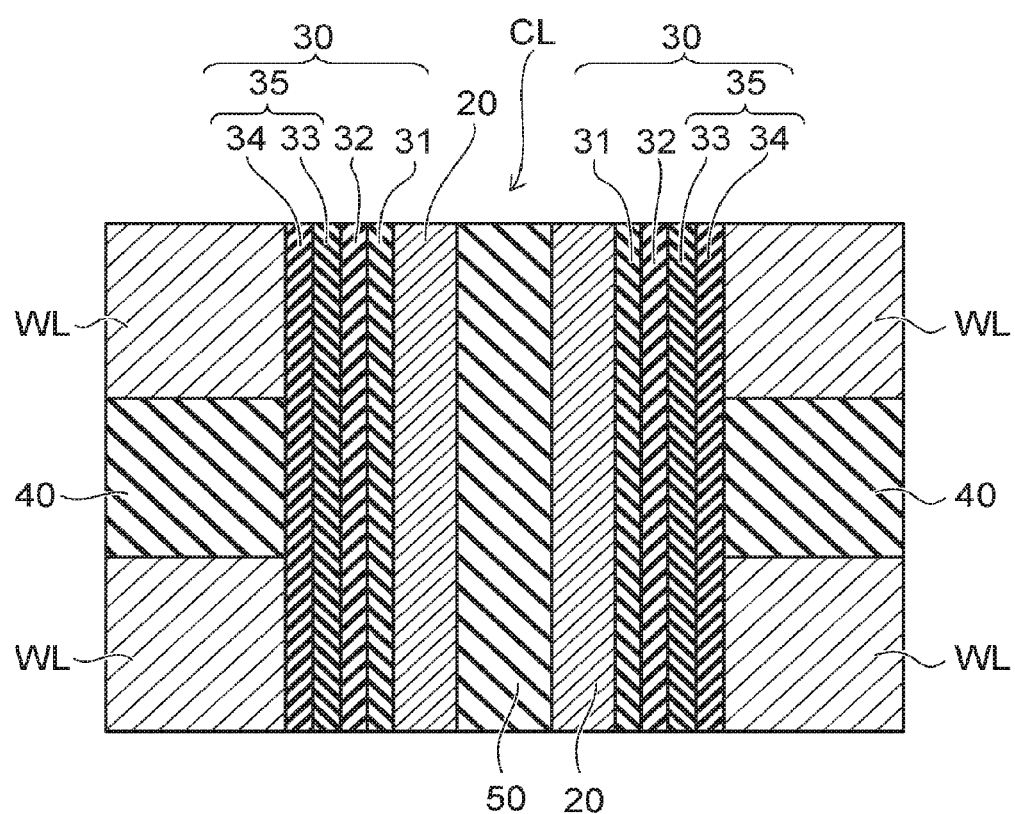
FIG. 3 is a schematic cross-sectional view of a memory cell of the embodiment.

FIG. 3 is an enlarged schematic cross-sectional view of a part of the column CL.

The column CL is formed inside the U-shaped memory hole formed inside the stacked body that includes an upper portion selection gate layer SG, a plurality of electrode layers WL, a plurality of insulating layers 40, and a back gate BG. A monocrystallized semiconductor channel 20 is provided inside the memory hole. The semiconductor channel 20 may be a polycrystalline film. An average grain size of crystals in the polycrystalline film is not less than the thickness of the polycrystalline film. The semiconductor channel 20 may be a silicon film. For example, if the electrode layers WL is the polycrystalline silicon, the impurity concentration of the semiconductor channel 20 is less than the impurity concentration of the electrode layer WL.

A memory film 30 is provided between the inner wall of the memory hole and the semiconductor channel 20. The memory film 30 includes a block insulating film 35, a charge storage film 32, and a tunnel insulating film 31.

The block insulating film 35, the charge storage film 32, and the tunnel insulating film 31 are provided in that order from the electrode layer WL side between the electrode layer WL and the semiconductor channel 20.

The semiconductor channel 20 is provided in a tubular shape extending in the stacking direction of the stacked body 100, and the memory film 30 is provided in a tubular shape while extending in the stacking direction of the stacked body 100 so as to surround the outer peripheral face of the semiconductor channel 20. The electrode layer WL surrounds the periphery of the semiconductor channel 20 interposed by the memory film 30. Also, a core insulating film 50 is provided on the inner side of the semiconductor channel 20. The core insulating film 50 is, for example, a silicon oxide film.

The block insulating film 35 contacts the electrode layer WL, the tunnel insulating film 31 contacts the semiconductor channel 20, and the charge storage film 32 is provided between the block insulating film 35 and the tunnel insulating film 31.

The semiconductor channel 20 functions as a channel in the memory cell transistor, and the electrode layer WL functions as a control gate of the memory cell transistor. The charge storage film 32 functions as a data memory layer that accumulates electric charges injected from the semiconductor channel 20. In other words, a memory cell is formed in a structure in which the control gate surrounds the periphery of the channel at the portion where the semiconductor channel 20 and each electrode layer WL intersect.

The semiconductor memory device of the embodiment is a non-volatile semiconductor memory device that can freely erase and write data electrically, and can retain the contents of the memory even when the power supply is turned off.

The memory cell is, for example, a charge trapping memory cell. The charge storage film 32 is, for example, a silicon nitride film and includes a large number of trap sites which trap charge. The charge storage film 32 may be a floating gate having conductivity and surrounded by an insulator.

The tunnel insulating film 31 serves as a potential barrier when electric charges are injected from the semiconductor channel 20 to the charge storage film 32 or when the electric charges accumulated in the charge storage film 32 diffuses into the semiconductor channel 20. The tunnel insulating film 31 is, for example, a silicon oxide film.

Alternatively, a stacked film in which a silicon nitride film is sandwiched by a pair of silicon oxide films (ONO film) may be used as the tunnel insulating film. When an ONO film is used as the tunnel insulating film, the erase operation can be carried out with a lower electric field than when a single layer of silicon oxide film is used.

The block insulating film 35 prevents the electric charges accumulated in the charge storage film 32 from diffusing into the electrode layer WL. The block insulating film 35 includes a cap film 34 provided in contact with the electrode layer WL, and a block film 33 provided between the cap film 34 and the charge storage film 32.

The block film 33 is, for example, a silicon oxide film. The cap film 34 is, for example, a silicon nitride film and has a greater dielectric constant than that of silicon oxide. By providing such a cap film 34 in contact with the electrode layer WL, back tunnel electrons injected from the electrode layer WL in erase operation can be suppressed. In other words, charge blocking characteristics can be increased by using a stacked film of a silicon oxide film and a silicon nitride film as the block insulating film 35.

As illustrated in FIGS. 1 and 2, a drain side select transistor STD is provided on the top end portion of one of the pair of columns CL in the U-shaped memory string MS, and a source side select transistor STS is provided on the top end portion of the other.

The memory cell, the drain side select transistor STD, and the source side select transistor STS are vertical transistors in which current flows in the stacking direction (Z-direction) of the stacked body 100.

The drain side selection gate SGD functions as a gate electrode (control gate) for the drain side select transistor STD. An insulating film 91 (illustrated in FIG. 2) which functions as a gate insulating film for the drain side select transistor STD is provided between the drain side selection gate SGD and the semiconductor channel 20.

The source side selection gate SGS functions as a gate electrode (control gate) for the source side select transistor STS. An insulating film 91 (illustrated in FIG. 2) which functions as a gate insulating film for the source side select transistor STS is provided between the source side selection gate SGS and the semiconductor channel 20.

The memory film 30 itself or a part of the memory film 30 may also be used as the gate insulating films 91 of the select transistors.

A back gate transistor BGT is provided on the connecting portion JP of the memory string MS. The back gate BG functions as a gate electrode (control gate) of the back gate transistor BGT. The memory film 30 provided within the back gate BG functions as a gate insulating film of the back gate transistor BGT.

A plurality of memory cells is provided between the drain side select transistor STD and the back gate transistor BGT with each of the electrode layers WL as the control gates. Likewise, a plurality of memory cells is provided between the back gate transistor BGT and the source side select transistor STS with each of the electrode layers WL as the control gates.

The plurality of memory cells, the drain side select transistor STD, the back gate transistor BGT, and the source side select transistor STS are serially connected via the semiconductor channel 20 and constitute a single U-shaped memory string MS. A plurality of memory cells is three-dimensionally provided in the X-direction, Y-direction, and Z-direction by arraying a plurality of the memory strings MS in the X-direction and the Y-direction.

A doped silicon layer 62 is provided on the top ends of the columns CL above the drain side selection gate SGD and source side selection gate SGS, as illustrated in FIG. 2.

The doped silicon layer 62 provided above the drain side selection gate SGD is electrically connected to the bit line BL via a contact plug 72. The doped silicon layer 62 provided above the source side selection gate SGS is electrically connected to the source layer SL via a contact plug 71.

The doped silicon layer 62 includes impurities that confer conductivity to the doped silicon layer 62. The doped silicon layer 62 functions as a gettering sink (gettering site), which absorbs (traps) a metal element that has remained in the single crystallized semiconductor channel 20 or the polycrystallized semiconductor channel 20 in the metal induced lateral crystallization (MILC) process as will be described later and a metal element in the metal silicide 52. An average grain size of the crystals in the polycrystallized semiconductor channel 20 is not less than the film thickness. The doped silicone layer 62 contains the metal element absorbed at that time.

This metal element is, for example, nickel (Ni), cobalt (Co), or palladium (Pd). The impurity added to the doped silicon layer 62 is an impurity other than a metal element, for example, phosphorus (P), arsenic (As), boron (B), or carbon (C).

The semiconductor channel 20 is a single crystalline film. The semiconductor channel 20 may be a polycrystalline film. An average grain size of crystals in the polycrystalline film is not less than the thickness of the polycrystalline film. The semiconductor channel 20 may also contain germanium (Ge).

The impurity concentration of the doped silicon layer 62 is greater than the impurity concentration of the semiconductor channel 20. The metal element concentration of the doped silicon layer 62 is greater than the metal element concentration of the semiconductor channel 20. The impurity concentration of the doped silicon layer 62 is greater than the metal element concentration of the doped silicon layer 62.

The metal element concentration of the semiconductor channel 20 after gettering described later is held to a concentration that does not affect the transistor characteristics of the memory cell, and is, for example, not greater than $1 \times 10^{19}$ [atoms/cc]. For this reason, the semiconductor channel 20 can be turned on and off by potential control of the electrode layer WL which is the control gate.

Figure 10A:
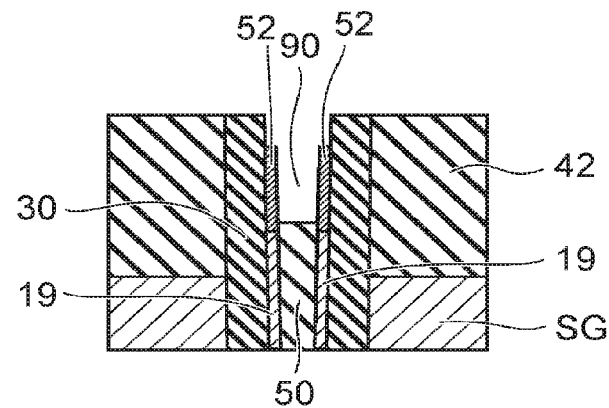
Figure 10B:
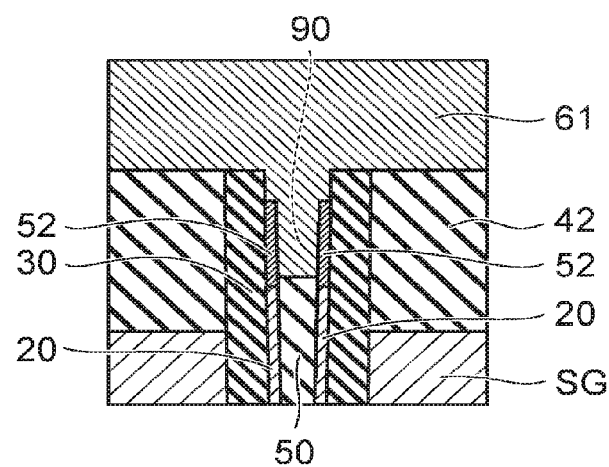
Figure 10C:
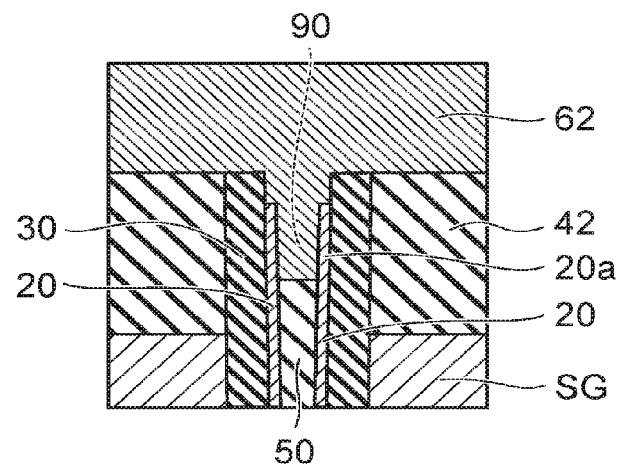

As illustrated in FIG. 10C, the position of the top end of the core insulating film 50 provided on the inner side of the semiconductor channel 20 is higher than the position of the top face of the selection gate layer SG. The periphery of the top end of the core insulating film 50 is surrounded by the insulating layer provided above the selection gate layer SG, and the semiconductor channel 20 and the memory film (the gate insulating film for the select transistor) 30 are interposed therebetween.

The semiconductor channel 20 includes an upper portion 20a, which protrudes out higher than the top end of the core insulating film 50.

The doped silicon layer 62 contacts the top end of the semiconductor channel 20. The doped silicon layer 62 is also provided on the inner side of the upper portion 20a of the semiconductor channel 20, and contacts the side surface of the upper portion 20a thereof.

As illustrated in FIG. 2, the semiconductor channel 20 is electrically connected to the source layer SL via the doped silicon layer 62 and the contact plug 71. The semiconductor channel 20 is electrically connected to the bit line BL via the doped silicon layer 62 and the contact plug 72.

The bottom end that contacts the core insulating film 50 in the doped silicon layer 62 is positioned higher than the top face of the selection gate layer SG. The boundary of the bottom end of the doped silicon layer 62 and the core insulating film 50 is positioned higher than the top face of the selection gate layer SG.

The impurity concentration of the upper portion 20a of the semiconductor channel 20 is greater than the impurity concentration of the semiconductor channel 20 of the memory cell. In other words, the impurity concentration of the upper portion 20a of the semiconductor channel 20 is greater than the impurity concentration of the portion that faces the electrode layer WL in the memory cell.

According to a semiconductor memory device of an embodiment, as will be described below, amorphous silicon is single crystallized or polycrystallized by the metal induced lateral crystallization (MILC) method to form the semiconductor channel 20 and improve channel mobility. An average grain size of crystals in the polycrystallized silicon is not less than the film thickness A method for manufacturing the semiconductor device of the embodiment will be described below with reference to FIGS. 4A to 10C.

Figure 4A:
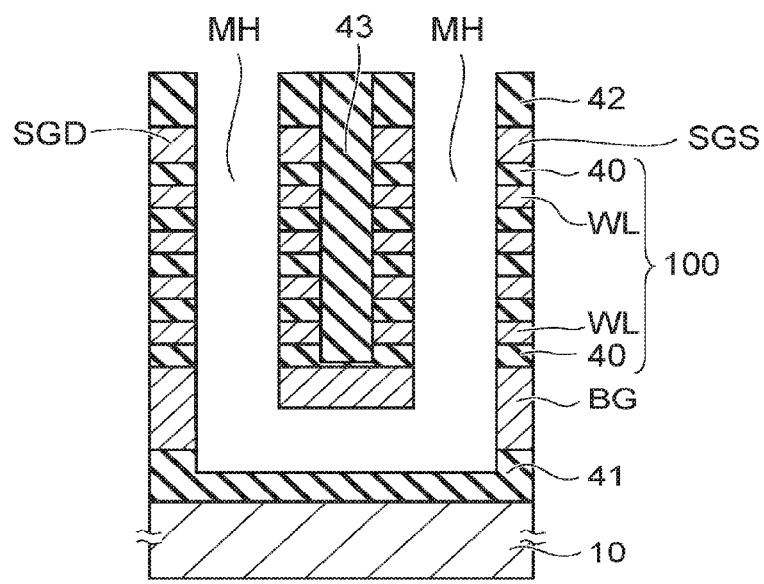
FIGS. 4A to 10C are schematic cross-sectional views showing a method for manufacturing the semiconductor device of the embodiment.

As illustrated in FIG. 4A, a back gate BG is formed on a substrate 10 interposed by an insulating layer 41, and further, a stacked body including electrode layers WL and insulating layers 40 is formed on the back gate BG.

A slit is formed in the stacked body, and an insulating isolating film 43 is embedded in the slit.

Figure 4B:
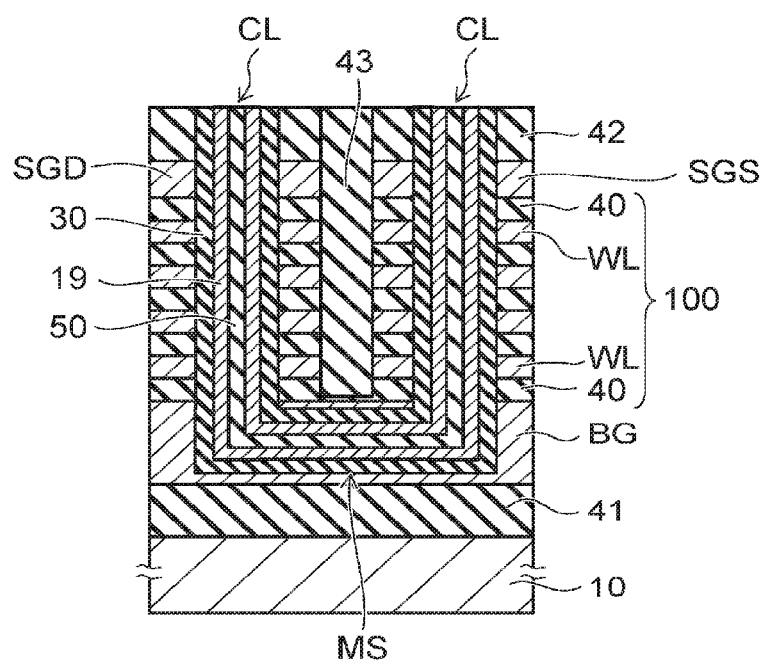

A U-shaped memory hole MH is formed in the stacked body that includes the back gate BG and the electrode layer WL above it. A memory film 30 is formed on the inner wall of the memory hole MH as illustrated in FIG. 4B. On the inner side of the memory film 30, for example, an amorphous silicon film 19 is formed as an amorphous semiconductor film. A core insulating film 50 is embedded on the inner side of the amorphous silicon film 19. The amorphous silicon film 19 may also contain germanium (Ge).

The amorphous silicon film 19 is a non-doped film that contains substantially no intentionally added impurities.

Figure 5A:
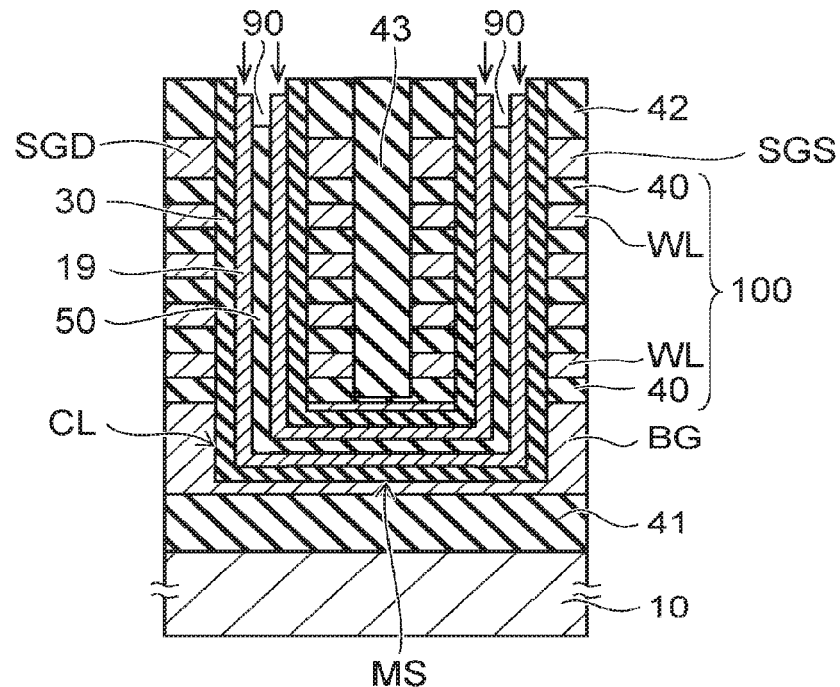
Figure 9A:
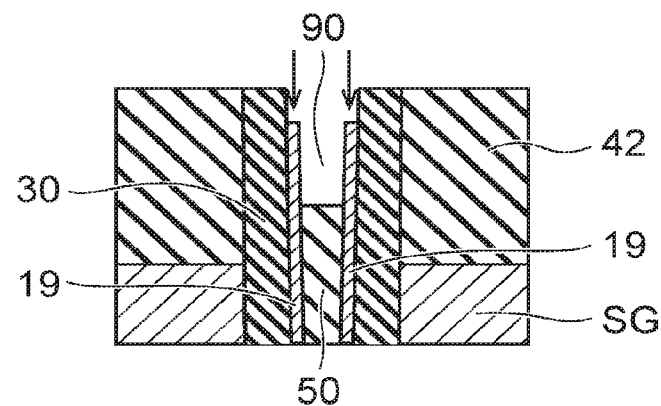

As illustrated in FIGS. 5A and 9A, the top end of the core insulating film 50 is retreated by etching the upper portion of the core insulating film 50. The top end of the core insulating film 50 is positioned above the top face of the selection gate layer SG. A recess 90 is formed on the top end of the core insulating film 50. A side surface of the amorphous silicon film 19 is exposed to the recess 90.

Figure 5B:
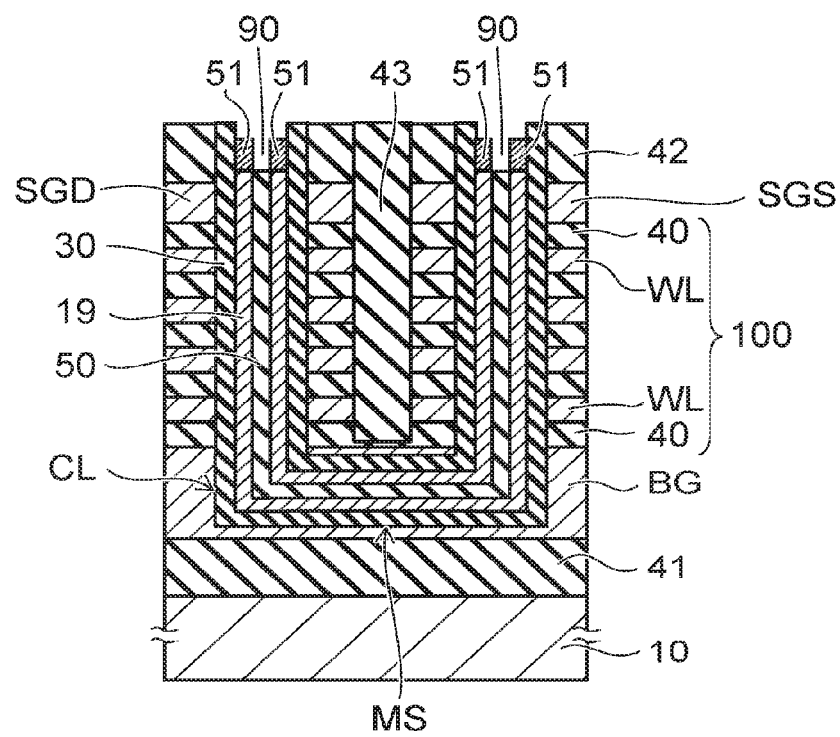
Figure 9B:
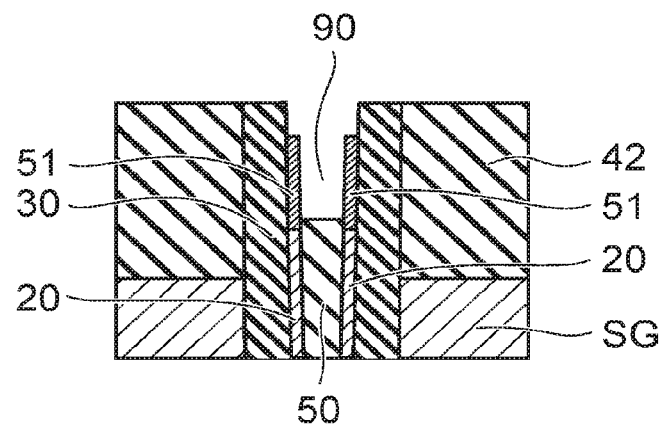

Impurities are introduced into the upper portion of the amorphous silicon film 19, and a doped amorphous silicon film 51 is formed on the upper portion of the amorphous silicon film 19, as illustrated in FIGS. 5B and 9B.

Figure 6A:
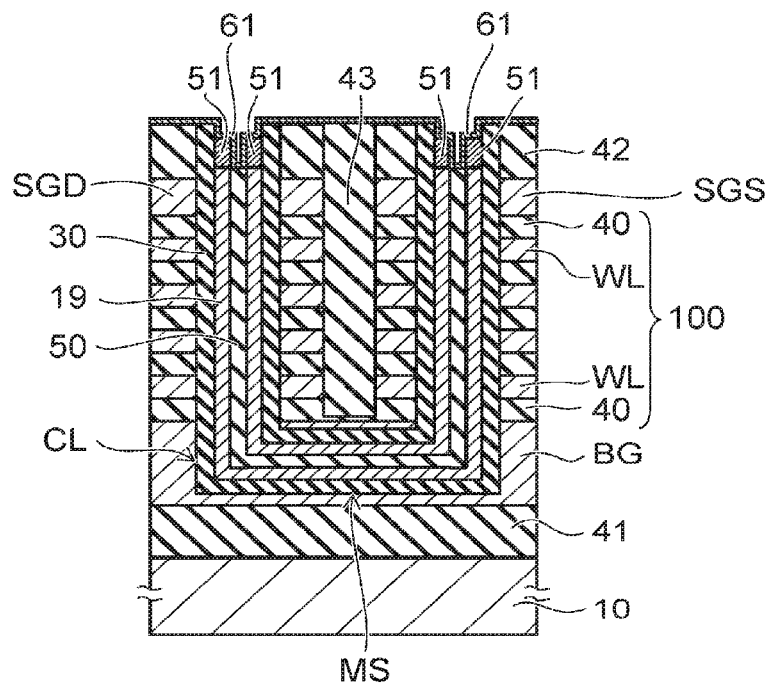
Figure 9C:
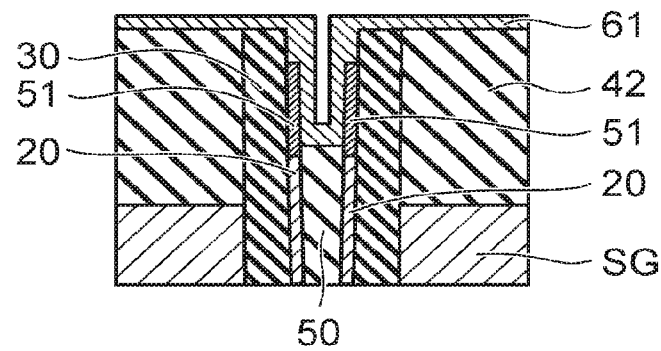

As illustrated in FIGS. 6A and 9C, a metal film 61 is formed on the top end and side surface of the doped amorphous silicon film 51. The metal film 61 is also formed on the top face of the stacked body.

The metal film 61 is, for example, a nickel film. Alternatively, the metal film 61 may be a cobalt film or palladium film.

Figure 6B:
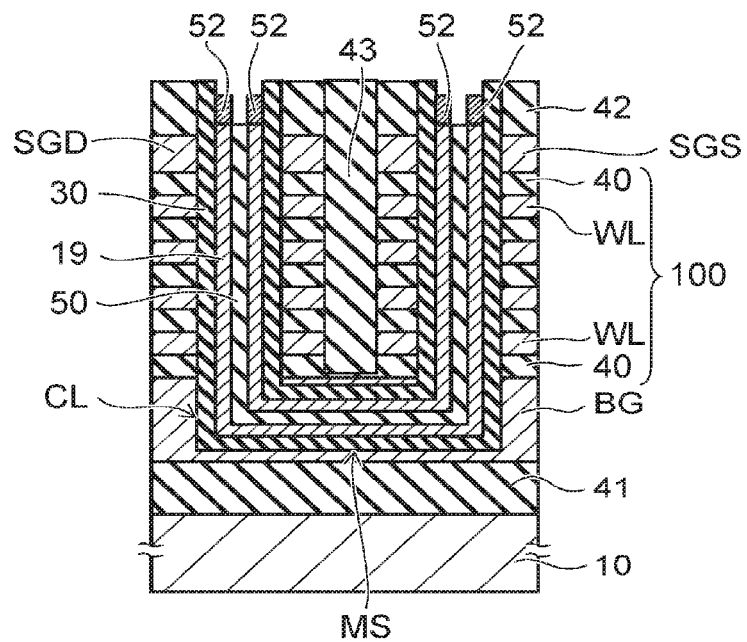

After the metal film 61 is formed, the doped amorphous silicon film 51 is turned into metal silicide by annealing, and a metal silicide film 52 is formed on the top end side of the amorphous silicon film 19 as illustrated in FIGS. 6B and 10A. Unreacted excess metal film 61 is removed.

The metal silicide film 52 is, for example, a nickel silicide (NiSix) film. Alternatively, the metal silicide film 52 may be a cobalt silicide film or palladium silicide film.

As illustrated in FIG. 10A, the metal silicide film 52 is formed on a region higher than the selection gate layer SG (a region surrounded by the insulating layer 42).

The annealing at a temperature not less than 550° C. is not performed until this process, so that the amorphous silicon film 19 is not crystallized and maintains amorphous state.

Then, annealing is performed at a temperature of, for example, not less than 500° C. and not greater than 750° C. As a result, MILC crystallization of the amorphous silicon film 19 proceeds with the metal silicide film 52 as a catalyst. The metal silicide film (nickel silicide film) 52 diffuses (migrates) inside the amorphous silicon film 19. In the course of this diffusion, the Si—Si bonds of the amorphous silicon film 19 are rearranged, and the region through which the metal silicide film 52 passes monocrystallizes. In other words, a semiconductor channel 20 of monocrystallized silicon is formed.

The semiconductor channel 20 becomes a polycrystalline film by the MILC process. An average grain size of crystals in a polycrystalline film is not less than its film thickness (the dimension between the memory film 30 and the core insulating film 50).

The crystal orientation of the monocrystallized silicon film (semiconductor channel) 20 is similar to the crystal orientation of the metal silicide film (nickel silicide film) 52. Here, "similar" indicates that the deviation of crystal orientation is within plus or minus 7°.

Figure 7A:
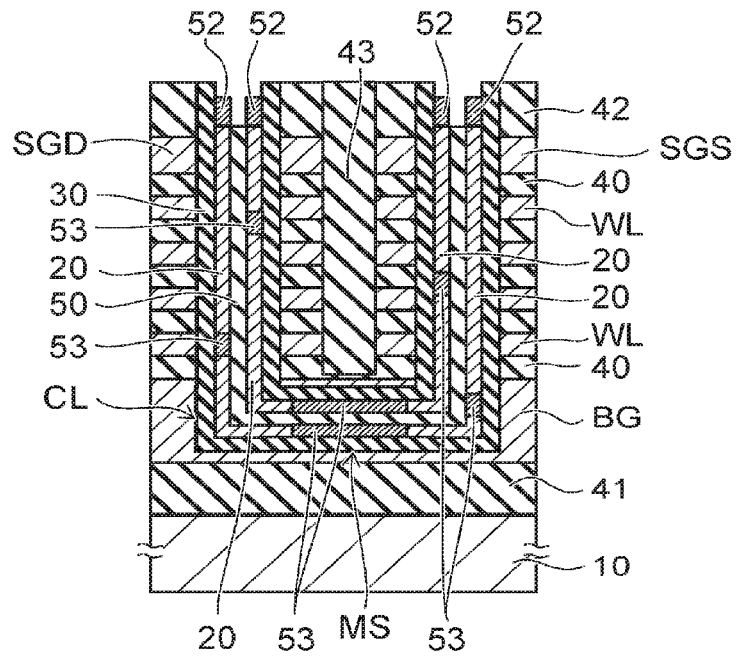

In the MILC process, the metal silicide film diffuses or migrates to the amorphous silicon film 19 and then remains in the semiconductor channel 20 with the single crystallization of the amorphous silicon film 19. The metal (nickel) used for catalyst, as shown in FIG. 7A, remains in the semiconductor channel 20 as metal silicide (nickel silicide) 53.

When metal is present in the semiconductor channel 20 directly below the gate of the memory cell transistor (the region faced by the electrode layer WL), the transistor of the memory cell sometimes does not operate. Furthermore, the presence of metal in the semiconductor channel 20, even if not directly below the gate, may potentially cause reduced cell transistor characteristics such as irregularity of the parasitic resistance of the memory string MS as a whole, a rise in off current, and degradation of tunnel film reliability due to diffusion of the metal in subsequent processes. For this reason, a technique for removing the metal in the semiconductor channel 20 is demanded.

Figure 7B:
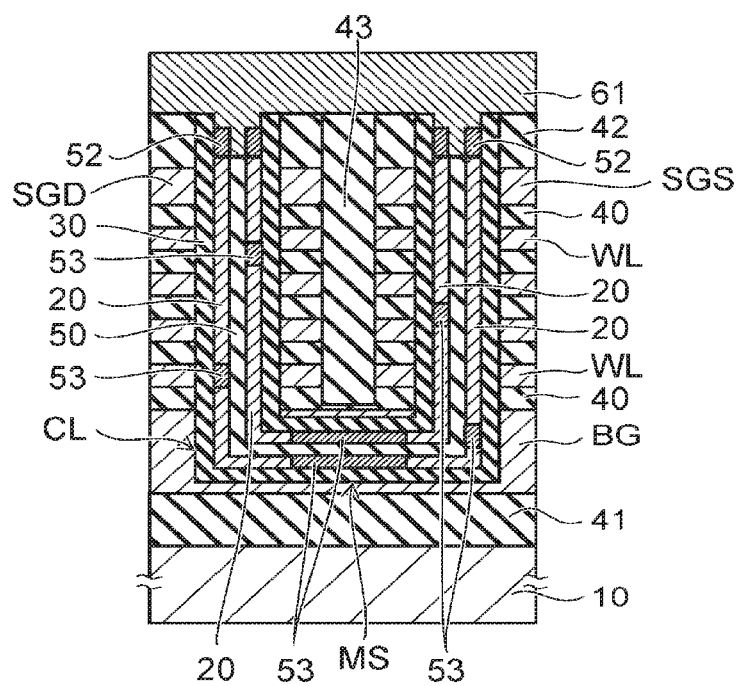

According to the embodiment, as illustrated in FIGS. 7B and 10B, a doped silicon layer 61 is formed so as to cover the metal silicide film 52 after the MILC process. The doped silicon layer 61 contains at least one of, for example, phosphorus, arsenic, boron, and carbon as impurities.

The doped silicon layer 61 is provided inside the recess 90 of the upper portion of the memory hole MH, and provided on the stacked body. The doped silicon layer 61 is embedded on the inner side of the metal silicide film 52 formed in a tubular shape. The doped silicon layer 61 contacts the top end and the side surface of the inner side of the metal silicide film 52.

Next, when annealing is performed, the metal (nickel) of the metal silicide (nickel silicide) 53 remaining in the semiconductor channel 20 separates, diffuses in the semiconductor channel 20, and is absorbed in the doped silicon layer 61. The metal in the metal silicide film 52 is also absorbed in the doped silicon layer 61.

In other words, the gettering sink (doped silicon layer 61) formed on the upper portion of the semiconductor channel 20 getters the metal in the semiconductor channel 20 and the metal inside the metal silicide film 52. As a result, the metal element concentration in the semiconductor channel 20 decreases greatly.

Figure 8A:
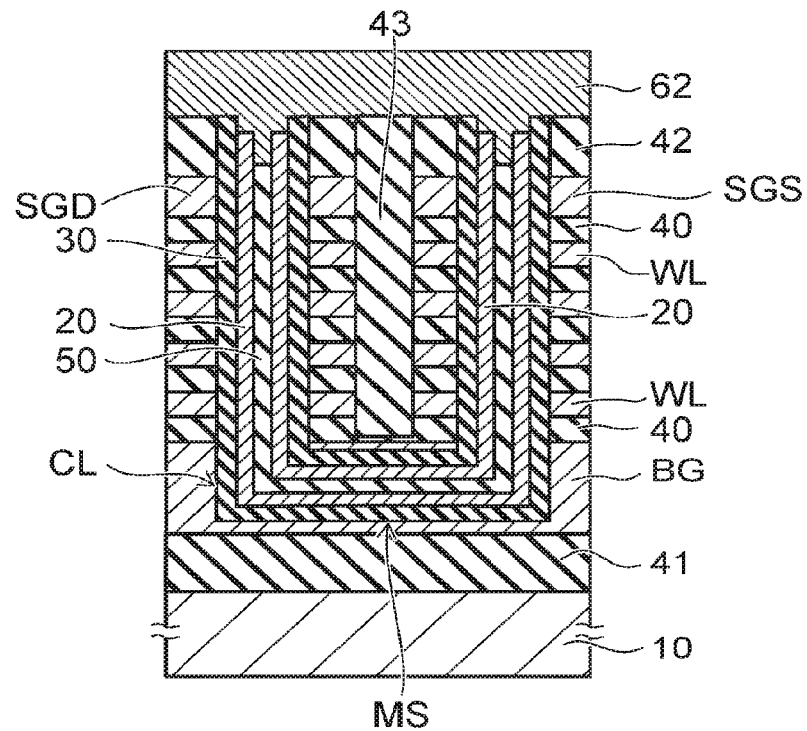

After gettering, a doped silicon layer 62 containing the gettered metal (nickel) and the impurities added prior to gettering is formed above the semiconductor channel 20 as illustrated in FIGS. 8A and 10C.

Figure 8B:
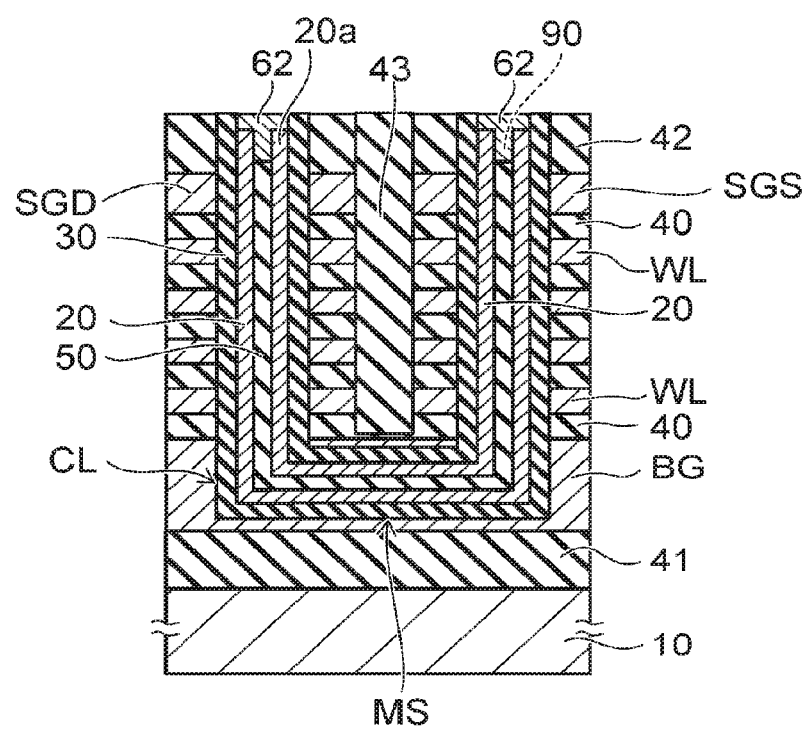

The doped silicon layer 62 on the stacked body is removed as illustrated in FIG. 8B. The doped silicon layer 62 inside the recess 90 is left remaining.

Next, the impurities introduced into the upper portion of the amorphous silicon film 19 at the process illustrated in above FIGS. 5A and 9A is activated by the annealing process. Therefore, the impurity concentration of the upper portion 20a of the semiconductor channel 20 becomes greater than the impurity concentration of the semiconductor channel 20 of the memory cell. This reduces the contact resistance between the doped silicon layer 62 and the semiconductor channel 20 and resistances of diffusion layers in the select transistors STD and STS.

The semiconductor channel 20 is connected with upper layer wiring (bit line BL or source layer SL) via the doped silicon layer 62 that contains metal. The doped silicon layer 62 that contains metal reduces the resistance between the semiconductor channel 20 and the upper layer wiring.

Because the upper portion 20a of relatively high impurity concentration is present in a region higher than the selection gate layer SG in the semiconductor channel 20, it does not degrade the characteristics of the select transistor.

According to the embodiment described above, the density of the crystal grains of the semiconductor channel 20 is decreased as the grain size becomes larger by the MILC process. This results in decreasing the grain trap density in the semiconductor channel 20, greatly improving the carrier mobility of the semiconductor channel 20, and increasing a cell current. Decreasing the grain trap density results in increasing a mutual conductance and decreasing S value. Also, decreasing the grain trap density reduces irregularities of threshold value, S value, and mutual conductance. Further, reducing these irregularities reduces irregularity of on current.

The metal that diffused into the semiconductor channel 20 in the MILC process can be removed from the semiconductor channel 20 by gettering by the doped silicon layer 62.

By holding the metal element concentration in the semiconductor channel 20 to a low level, the memory cell transistor can be appropriately cut off and the off current can be low.

Removing metal residues decreases operation failure of the transistor, reduces S value, and increases a mutual conductance. Removing metal residues also reduces irregularities of threshold value, S value, and mutual conductance.

Additionally, because the irregularity of metal content in the semiconductor channel 20 can be reduced, irregularity of memory string resistance, irregularity of on current, and irregularity of off current can be reduced.

The cell current of the semiconductor channel 20 that was monocrystallized by the MILC process can be greater than that of a polycrystalline silicon channel formed without using the MILC process.

Figure 11:
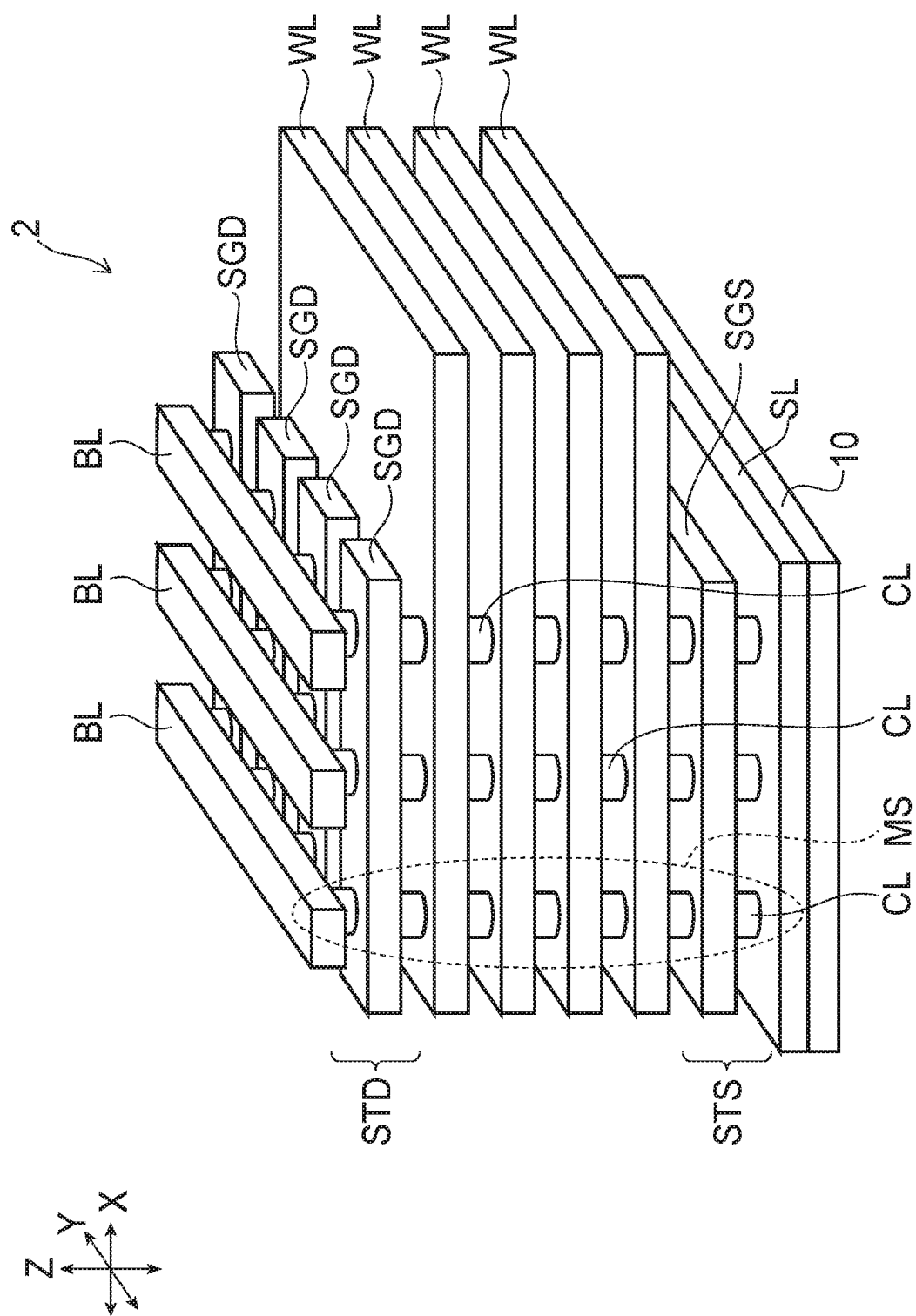
FIG. 11 is a schematic perspective view of a memory string of another embodiment.

Next, FIG. 11 is a schematic perspective view of a memory cell array 2 of another example of a semiconductor memory device of an embodiment. In FIG. 11, like in FIG. 1, insulating layers between electrode layers WL and the like have been omitted for ease of understanding the drawing.

In FIG. 11, two mutually perpendicular directions parallel to the major surface of a substrate 10 are defined as the X-direction and the Y-direction, and the direction perpendicular to both the X-direction and the Y-direction is defined as the Z-direction (stacking direction).

A source layer SL is provided on a substrate 10. A source side selection gate (lower portion selection gate layer) SGS is provided interposed by an insulating layer on the source layer SL.

An insulating layer is provided on the source side selection gate SGS, and a stacked body is provided on the insulating layer, the stacked body including a plurality of electrode layers WL and a plurality of insulating layers which are alternately stacked.

An insulating layer is provided on the topmost layer of the electrode layers WL, and a drain side selection gate (upper portion selection gate layer) SGD is provided on the insulating layer.

Columns CL extending in the Z-direction are provided in the stacked body. In other words, columns CL penetrate through the drain side selection gate SGD, the plurality of electrode layers WL, and the source side selection gate SGS. The top end of a semiconductor channel 20 in the column CL is connected to a bit line BL via a doped silicon layer 62, similar to the embodiment described above. The bottom end of the semiconductor channel 20 is connected to the source layer SL.

In the memory cell array 2 illustrated in FIG. 11, similar to the embodiment described above, the metal that diffused into the semiconductor channel 20 in the MILC process can be removed from the semiconductor channel 20 by gettering by the doped silicon layer 62 while greatly improving the carrier mobility of the semiconductor channel 20 through the MILC process.

In the process of forming the stacked body of the embodiment described above, for example, silicon layers having mutually different impurity concentrations may also be alternately stacked. Then, one silicon layer (for example, a silicon layer of low impurity concentration) may be removed by etching through a slit or memory hole formed in the stacked body utilizing a difference in etching rate due to the difference in impurity concentration, and by embedding an insulating layer in the space from which the silicon layer was removed, a stacked body in which electrode layers and insulating layers are alternately stacked may be formed.

Alternatively, silicon nitride films and silicon oxide films may be alternately stacked. Also, for example, a silicon nitride film may be removed by etching through a slit or memory hole formed in the stacked body, and, by burying an electrode layer (metal layer) in the space from which the silicon nitride film was removed, a stacked body in which electrode layers and insulating layers (silicon oxide films) are alternately stacked may be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a stacked body including a plurality of electrode layers, an insulator being interposed between the electrode layers; and
a column extending in a stacking direction in the stacked body;
the column including
a semiconductor channel extending in the stacking direction, the semiconductor channel being a polycrystalline, an average grain size of crystals in the polycrystalline being not less than a film thickness of the semiconductor channel, the film thickness being a thickness along a direction perpendicular to an extending direction of the semiconductor channel,
a charge storage film provided between the semiconductor channel and one of the electrode layers, and
a doped silicon layer containing a metal element and a non-metallic impurity, the doped silicon layer being in direct contact with a top end of the semiconductor channel.

2. The device according to claim 1, wherein the doped silicon layer contains at least one of phosphorus, arsenic, boron, and carbon as the impurity.

3. The device according to claim 2, wherein an impurity concentration of the doped silicon layer is higher than an impurity concentration of the semiconductor channel.

4. The device according to claim 1, wherein the doped silicon layer contains at least one of nickel, cobalt, and palladium as the metal element.

5. The device according to claim 4, wherein a concentration of the metal element in the doped silicon layer is higher than an impurity concentration of the semiconductor channel.

6. The device according to claim 4, wherein a concentration of the metal element in the semiconductor channel is not higher than $1 \times 10^{19}$ [atoms/cc].

7. The device according to claim 1, wherein the semiconductor channel contains a polycrystalline silicon, an average grain size of crystals in the polycrystalline silicone being not less than a film thickness of the semiconductor channel, the film thickness being a thickness along a direction perpendicular to an extending direction of the semiconductor channel.

8. The device according to claim 1, further comprising a selection gate layer provided above the stacked body.

9. The device according to claim 8, wherein a bottom end of the doped silicon layer is positioned higher than a top face of the selection gate layer.

10. The device according to claim 1, wherein
the semiconductor channel is provided in a tubular shape, and
the doped silicon layer is provided on an inner side of a top portion of the semiconductor channel, and directly contacts a side surface of the top portion of the semiconductor channel.

11. The device according to claim 10, wherein an impurity concentration of the top portion of the semiconductor channel is higher than an impurity concentration of a portion that faces one of the electrode layers in the semiconductor channel.

12. The device according to claim 10, further comprising
a selection gate layer provided above the stacked body, and
an insulating film provided on an inner side of the semiconductor channel,
wherein
a boundary of a bottom end of the doped silicon layer and the insulating film is positioned higher than a top face of the selection gate layer.

13. The device according to claim 1, wherein
the doped silicon layer contains at least one of nickel, cobalt, and palladium as the metal element,
the doped silicon layer contains at least one of phosphorus, arsenic, boron, and carbon as the impurity, and
an impurity concentration of the doped silicon layer is higher than a metal element concentration of the doped silicon layer.

* * * * *